United States Patent
Demos et al.

(10) Patent No.: US 9,502,263 B2
(45) Date of Patent: Nov. 22, 2016

(54) UV ASSISTED CVD ALN FILM FOR BEOL ETCH STOP APPLICATION

(71) Applicant: Applied Materials, Inc., Santa Clara, CA (US)

(72) Inventors: Alexandros T. Demos, Fremont, CA (US); Deenesh Padhi, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/933,826

(22) Filed: Nov. 5, 2015

(65) Prior Publication Data

US 2016/0172211 A1 Jun. 16, 2016

Related U.S. Application Data

(60) Provisional application No. 62/091,836, filed on Dec. 15, 2014.

(51) Int. Cl.
*H01L 21/302* (2006.01)
*H01L 21/311* (2006.01)

(52) U.S. Cl.
CPC ................ *H01L 21/31116* (2013.01)

(58) Field of Classification Search
CPC ........... H01L 21/31116; H01L 21/336; H01L 21/762; H01L 21/76224; H01L 21/76825; H01L 29/66; H01L 29/66545; H01L 29/78; H01L 29/78684
USPC ............... 438/740, 680, 787, 788, 791, 746; 257/E21.006, E21.129, E21.17, 257/E21.267, E21.278, E21.293, E21.347, 257/E21.229
See application file for complete search history.

(56) References Cited

U.S. PATENT DOCUMENTS

| | | | | |
|---|---|---|---|---|
| 7,829,460 B2* | 11/2010 | Streck | ................... | C23C 16/303 438/653 |
| 8,222,135 B2* | 7/2012 | Streck | ................... | C23C 16/303 438/637 |
| 8,384,217 B2* | 2/2013 | Streck | ................... | C23C 16/303 257/741 |
| 9,190,489 B1* | 11/2015 | Mountsier | ......... | H01L 21/76224 |
| 9,230,800 B2* | 1/2016 | LaVoie | ................ | H01L 21/0228 |
| 2010/0320548 A1 | 12/2010 | Tsau | | |
| 2012/0196450 A1 | 8/2012 | Balseanu | | |
| 2014/0162416 A1 | 6/2014 | Romano et al. | | |

FOREIGN PATENT DOCUMENTS

EP 0908942 A2 4/1999
JP 2013-084643 A 5/2013

OTHER PUBLICATIONS

PCT International Search Report for International application No. PCT/US2015/059761 dated Feb. 18, 2016, 3 pages.

* cited by examiner

*Primary Examiner* — David Nhu
(74) *Attorney, Agent, or Firm* — Patterson & Sheridan, LLP

(57) ABSTRACT

Implementations described herein generally relate to methods for depositing etch stop layers, such as AlN layers, using UV assisted CVD. Methods disclosed herein generally include positioning a substrate in a process region of a process chamber; delivering an aluminum-containing precursor to the process region, the aluminum-containing precursor depositing an aluminum species onto the substrate; purging the process region of aluminum-containing precursor using an inert gas; delivering a UV responsive nitrogen-containing precursor to the process region, the UV responsive nitrogen-containing gas being activated using UV radiation to create nitrogen radicals, the nitrogen radicals reacting with the aluminum species to form an AlN layer; and purging the process region of UV responsive nitrogen-containing precursor using an inert gas.

17 Claims, 4 Drawing Sheets

UV ASSISTED CVD ALN FILM FOR BEOL ETCH STOP APPLICATION

CROSS-REFERENCE TO RELATED APPLICATIONS

This application claims benefit of U.S. Provisional Patent Application Ser. No. 62/091,836, filed Dec. 15, 2014, which is herein incorporated by reference.

BACKGROUND

Field

Implementations described herein generally relate to deposition of etch stop films. More specifically, implementations described herein generally relate to AlN deposition in back end of line (BEOL) processing.

Description of the Related Art

With continued device scaling, interconnect RC delay continues to escalate. Among several efforts being made to address this challenge, one is to lower the capacitance contributed by the dielectric diffusion barrier layer. Lowering the capacitance can be achieved by either lowering the dielectric constant or physically thinning down the barrier although there are trade-offs with each approach.

Lower k barriers are generally less dense materials which limit their ability to function as robust barrier to oxidation, moisture penetration and Cu diffusion. On the other hand, physically thinning down the barrier is constrained by the ability of the thin layer to serve as an effective etch stop layer, especially given micro-loading and non-uniformity of dry etch processes. In this context, traditional SiCN based or SiOC based barrier/etch stop layers have reached their scaling limit.

Bilayers of alternative materials with much higher dry/etch etch selectivity and SiCN/SiOC have been considered in order to continue scaling effective capacitance while affording adequate etch stop protection. From this perspective, aluminum nitride (AlN) is an attractive material. AlN has excellent selectivity to ultra low k (ULK) etch, good insulating properties and reasonable dielectric constant of 8-9. Traditionally, AlN is deposited by CVD or ALD methods. These methods tend to leave undesired organic ligands in the film resulting in inferior material quality. Plasma enhanced ALD (PEALD) can yield superior film quality by employing plasma treatment steps; but plasma treatments can damage underlying ULK.

Therefore, a there is a need for alternative methods of depositing AlN layers for BEOL processes.

SUMMARY

Implementations described herein provide improved AlN deposition in back end of line (BEOL) processing.

In one implementation, a method of depositing an etch stop layer can include positioning a substrate in a process region of a process chamber; delivering an aluminum-containing precursor to the process region, the aluminum-containing precursor being activated using UV radiation; purging the process region using an inert gas; delivering a UV responsive nitrogen-containing gas to the process region, the UV responsive nitrogen-containing gas being activated using UV radiation; and purging the process region using an inert gas.

In another implementation, a method of depositing an etch stop layer can include positioning a substrate in a process region of a process chamber; and depositing a plurality of etch stop layers. The deposition can include delivering an aluminum-containing precursor to the process region, the aluminum-containing precursor being activated using UV radiation; purging the process region using an inert gas; delivering a UV responsive nitrogen-containing gas to the process region, the UV responsive nitrogen-containing gas being activated using UV radiation; purging the process region using an inert gas; and repeating delivering an aluminum containing precursor, purging, delivering a UV responsive nitrogen-containing gas and purging until the desired thickness is achieved.

In another implementation, a method of depositing an etch stop layer can include positioning a substrate in a process region of a process chamber; delivering trimethylaluminum (TMA) to the process region, the aluminum-containing precursor being activated using UV radiation; purging the process region using an inert gas; delivering a UV responsive nitrogen-containing gas to the process region, the UV responsive nitrogen-containing gas being activated using UV radiation; and purging the process region using an inert gas.

BRIEF DESCRIPTION OF THE DRAWINGS

So that the manner in which the above recited features of the present disclosure can be understood in detail, a more particular description of the methods and apparatus, briefly summarized above, may be had by reference to implementations, some of which are illustrated in the appended drawings. It is to be noted, however, that the appended drawings illustrate only typical implementations of this methods and apparatus and are therefore not to be considered limiting of its scope, for the methods and apparatus may admit to other equally effective implementations.

Figure 1:
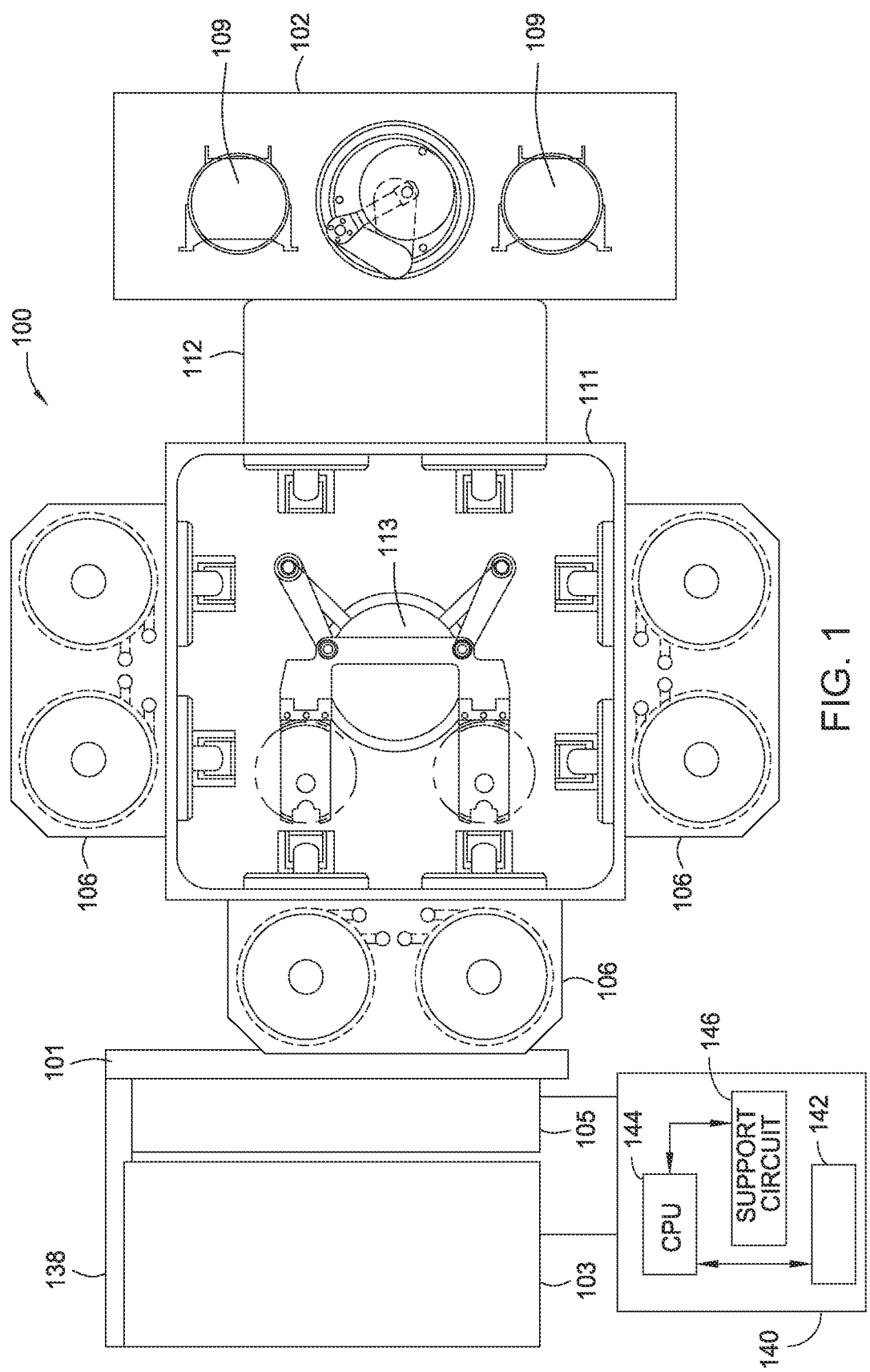
FIG. 1 is a plan view of a semiconductor processing system in which implementations may be incorporated.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

Implementations of the present disclosure provide methods for AlN deposition in back end of line (BEOL) processing. In implementations disclosed herein, UV assisted CVD is employed to deposit high quality AlN film. As explained more fully below, a multi-step approach of delivering an Al-bearing precursor, purging, delivering $NH_3$, purge is envisioned. UV radiation can be delivered during the delivery of the Al-bearing precursor, the $NH_3$, or both. Implementations disclosed herein are more clearly described with reference to the figures below.

FIG. 1 shows a plan view of a semiconductor processing system 100 which may use implementations. The system 100 illustrates one implementation of a Producer™ processing system, commercially available from Applied Materials, Inc., of Santa Clara, Calif. The processing system 100 is a self-contained system having the necessary processing utilities supported on a mainframe structure 101. The processing system 100 generally includes a front end staging area 102 where substrate cassettes 109 are supported and substrates are loaded into and unloaded from a loadlock chamber 112, a transfer chamber 111, a series of tandem processing chambers 106 mounted on the transfer chamber 111, and a back end 138 which houses the support utilities needed for operation of the system 100, such as a gas panel 103, and a power distribution panel 105.

Each of the tandem processing chambers 106 can include two processing regions for processing the substrates. The two processing regions share a common supply of gases, common pressure control, and common process gas exhaust/pumping system. Modular design of the system enables rapid conversion from any one configuration to any other. The arrangement and combination of chambers may be altered for purposes of performing specific process steps. Any of the tandem processing chambers 106 can include a lid according to aspects of the implementations as described below that includes one or more ultraviolet (UV) lamps for use in a UV assisted CVD (UV-CVD) process on the substrate. In one implementation, all three of the tandem processing chambers 106 have UV lamps and are configured as UV deposition chambers to run in parallel for maximum throughput.

In an alternative implementation where not all of the tandem processing chambers 106 are configured as UV-CVD chambers, the system 100 can be adapted with one or more of the tandem processing chambers having supporting chamber hardware known to accommodate various other known processes such as chemical vapor deposition (CVD), physical vapor deposition (PVD), etch, and the like.

A controller 140, including a central processing unit (CPU) 144, a memory 142, and support circuits 146, is coupled to the various components of the semiconductor processing system 100 to facilitate control of the processes as described herein. The memory 142 can be any computer-readable medium, such as random access memory (RAM), read only memory (ROM), floppy disk, hard disk, or any other form of digital storage, local or remote to the semiconductor processing system 100 or CPU 144. The support circuits 146 are coupled to the CPU 144 for supporting the CPU in a conventional manner. These circuits include cache, power supplies, clock circuits, input/output circuitry and subsystems, and the like. A software routine or a series of program instructions stored in the memory 142, when executed by the CPU 144, causes the UV curing tandem processing chambers 106 to perform processes as described herein.

Figure 2:
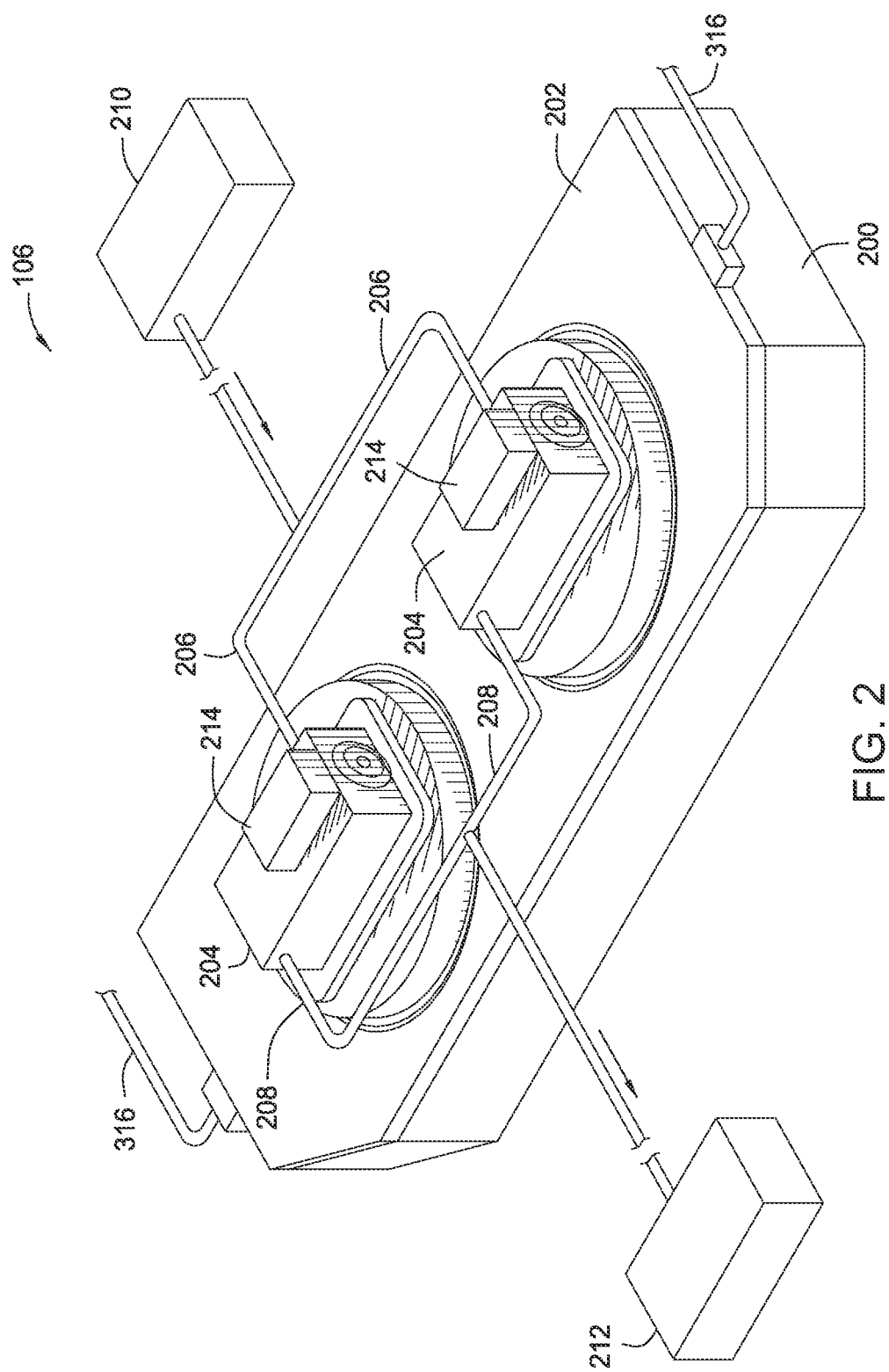
FIG. 2 is a view of a tandem processing chamber of the semiconductor processing system that is configured for UV assisted CVD.

FIG. 2 illustrates one of the tandem processing chambers 106 of the semiconductor processing system 100 that is configured for UV-CVD. The tandem processing chamber 106 includes a body 200 and a lid 202 that can be hinged to the body 200. The chamber body 200 may be made from aluminum. Coupled to the lid 202 are two housings 204 that are each coupled to inlets 206 along with outlets 208 for passing cooling air through an interior of the housings 204. The cooling air can be at room temperature or approximately twenty-two degrees Celsius. A central pressurized air source 210 provides a sufficient flow rate of air to the inlets 206 to insure proper operation of any UV lamp bulbs and/or power sources 214 for the bulbs associated with the tandem processing chamber 106. The outlets 208 receive exhaust air from the housings 204, which exhaust is collected by a common exhaust system 212 that can include a scrubber to remove ozone potentially generated by the UV bulbs, depending on bulb selection.

Figure 3:
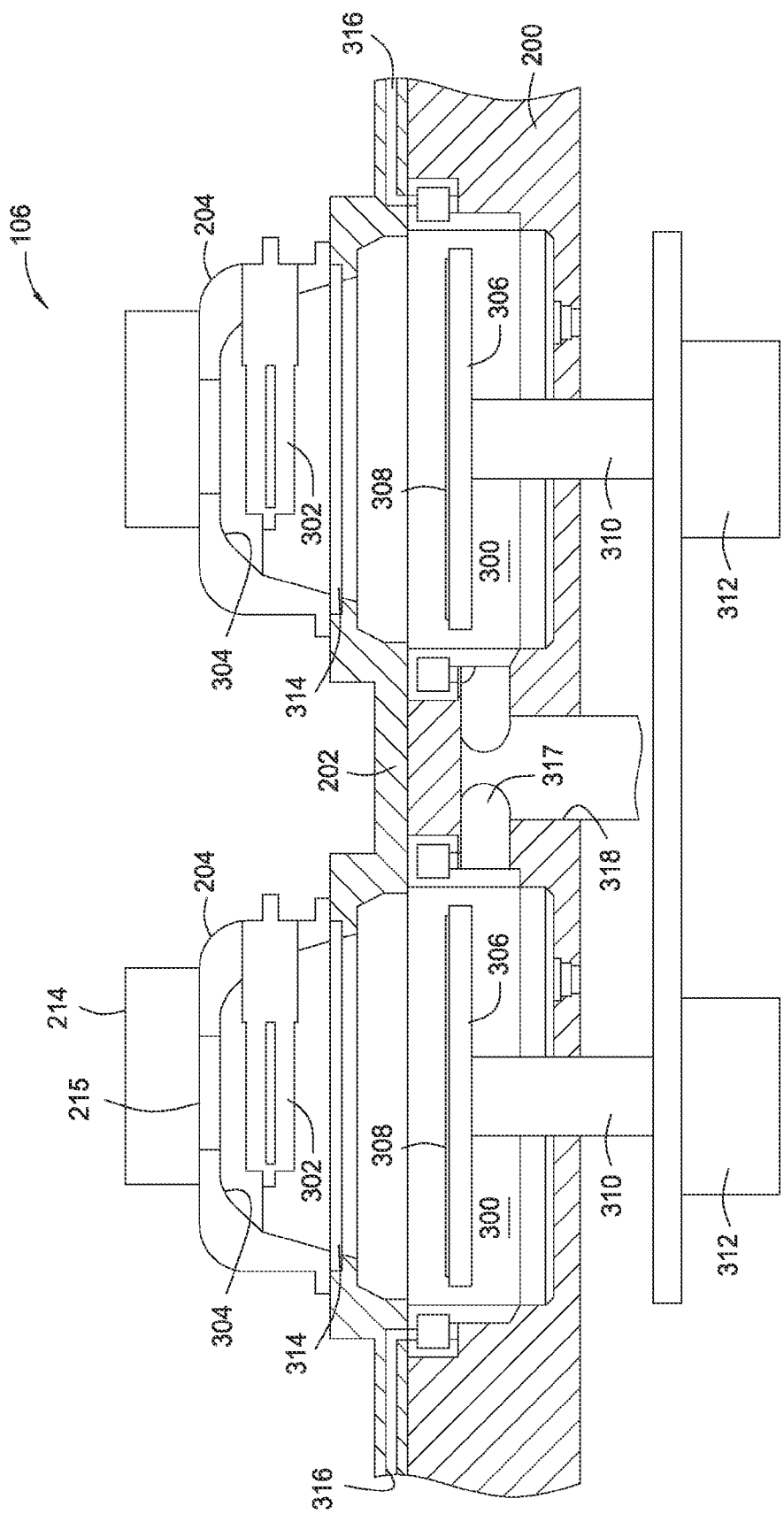
FIG. 3 is a partial section view of the tandem processing chamber that has a lid assembly with two UV bulbs disposed respectively above two processing regions.

FIG. 3 shows a partial section view of the tandem processing chamber 106 with the lid 202, the housings 204 and the power sources 214. Each of the housings 204 cover a respective one of two UV lamp bulbs 302 disposed respectively above two processing regions 300 defined within the body 200. Each of the processing regions 300 includes a heating substrate support, such as substrate support 306, for supporting a substrate 308 within the processing regions 300. The substrate supports 306 can be made from ceramic or metal such as aluminum. Preferably, the substrate supports 306 couple to stems 310 that extend through a bottom of the body 200 and are operated by drive systems 312 to move the substrate supports 306 in the processing regions 300 toward and away from the UV lamp bulbs 302. The drive systems 312 can also rotate and/or translate the substrate supports 306 during UV-CVD deposition to further enhance uniformity. Adjustable positioning of the substrate supports 306 enables control of volatile by-product and purge and clean gas flow patterns and residence times in addition to potential fine tuning of incident UV irradiance levels of process gases for deposition on the substrate 308.

In general, any UV source such as mercury microwave arc lamps, pulsed xenon flash lamps, or UV light emitting diode arrays may be used. The UV lamp bulbs 302 are sealed plasma bulbs filled with one or more gases such as xenon (Xe) or mercury (Hg) for excitation by the power sources 214. Preferably, the power sources 214 are microwave generators that can include one or more magnetrons (not shown) and one or more transformers (not shown) to energize filaments of the magnetrons. In one implementation having kilowatt microwave (MW) power sources, each of the housings 204 includes an aperture 215 adjacent the power sources 214 to receive up to about 6000 W of microwave power from the power sources 214 to subsequently generate up to about 100 W of UV light from each of the bulbs 302. In another implementation, the UV lamp bulbs 302 can include an electrode or filament therein such that the power sources 214 represent circuitry and/or current supplies, such as direct current (DC) or pulsed DC, to the electrode.

Preferably, the bulbs 302 emit light across a broad band of wavelengths from 170 nm to 400 nm. In one implementation, the bulbs 302 emit light at wavelengths from 185 nm to 255 nm. The gases selected for use within the bulbs 302 can determine the wavelengths emitted. UV light emitted from the UV lamp bulbs 302 enters the processing regions 300 by passing through windows 314 disposed in apertures in the lid 202. The windows 314 may be made of an OH free synthetic quartz glass and have sufficient thickness to maintain vacuum without cracking. Further, the windows 314 may be fused silica that transmits UV light down to approximately 150 nm. Since the lid 202 seals to the body 200 and the windows 314 are sealed to the lid 202, the processing regions 300 provide volumes capable of maintaining pressures from approximately 1 Torr to approximately 650 Torr. Processing or cleaning gases enter the processing regions 300 via a respective one of two inlet passages 316. The processing or cleaning gases then exit the processing regions 300 via outlets 317 into a common outlet port 318. Additionally, the cooling air supplied to the interior of the housings 204 circulates past the bulbs 302, but is isolated from the processing regions 300 by the windows 314.

The housings 204 may include an interior parabolic surface defined by a cast quartz lining 304. The quartz linings 304 reflect UV light emitted from the UV lamp bulbs 302 and are shaped to suit the UV assisted CVD processes based on the pattern of UV light directed by the quartz linings 304 into the processing regions 300. Substrates are brought into the processing region 300 to deposit a layer, such as an etch stop layer, on the substrate 308. The etch stop layer may be an aluminum-containing layer, such as an aluminum nitride (AlN) layer.

Figure 4:
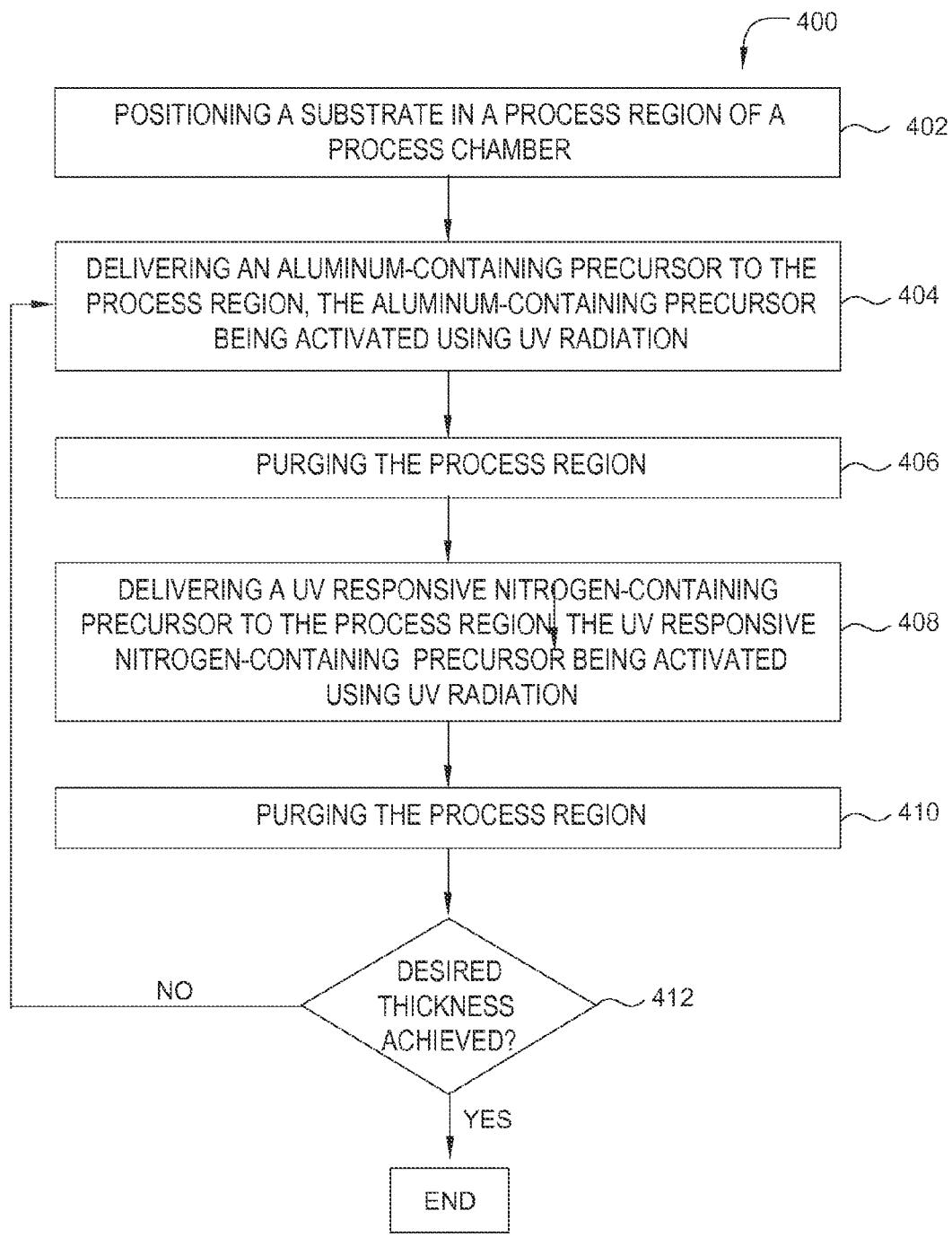
FIG. 4 is a block diagram of a method of deposition an etch stop layer according to one implementation.

FIG. 4 is a block diagram of a method 400 of depositing an etch stop layer according to implementations described herein. The etch stop layer described in this exemplary implementation is an AlN layer. The method 400 includes positioning a substrate in a process region of a process chamber, at 402; delivering an aluminum-containing precursor to the process region, the aluminum-containing precursor being activated using UV radiation, at 404; purging the process region, at 406; delivering a UV responsive nitrogen-containing gas to the process region, the UV responsive nitrogen-containing gas being activated using UV radiation, at 408; purging the process region using an inert gas, at 410; and repeating delivering an aluminum containing precursor, purging, delivering a UV responsive nitrogen-containing gas and purging until the desired thickness is achieved, at 412. Implementations described yield superior film quality while avoiding damage to the underlying ultra low k (ULK) materials. The above method can be performed sequentially.

The method 400 begins by positioning a substrate in a process region of a process chamber, at 402. The process chamber can be a process chamber 106 as described with reference to FIGS. 1, 2 and 3. The process chamber has a process region that allows for controlled pressure and temperature. Further the process chamber has a radiation source which can produce UV radiation.

The substrate may be a substrate used in semiconductor production or processing. The substrate can be, among others, a thin sheet of metal, plastic, organic material, silicon, glass, quartz, or polymer materials. In one implementation, the substrate is a silicon-containing substrate upon which a plurality of dielectric layers will be deposited. In other implementations, the substrate may be a doped or otherwise modified silicon-containing substrate.

With the substrate positioned, an aluminum-containing precursor can be delivered to the process region, at 404. The aluminum-containing precursor may include, but is not necessarily limited to trimethyaluminum (TMA), triethylaluminum, trimethylamine alane, aluminum chloride, dimethylaluminium hydride and diethylaluminium ethoxide. The aluminum-containing precursor can be delivered at a flow rate from about 1 standard cubic centimeters per minute (sccm) to about 500 sccm in an inert gas flow from about 10 sccm to about 5000 sccm. In another implementation, the aluminum-containing precursor can be delivered at a flow rate from about 5 sccm to about 100 sccm in an inert gas flow from about 50 sccm to about 1000 sccm.

The aluminum-containing precursor is activated using UV radiation. The UV radiation can have a wavelength of between 170 nm to about 400 nm. The temperature of the process region can be maintained between about 0 degrees Celsius and about 200 degrees Celsius, such as between about 0 degrees Celsius and about 100 degrees Celsius. The aluminum-containing precursor will deposit an aluminum species on the surface of the substrate. The speed of the deposition or adsorption is increased by the activation.

In one implementation where TMA is used, TMA is delivered alongside an inert gas (e.g., He, Ar etc.) to adsorb on dielectrics and metal interconnect surfaces. During this time, UV can be turned on to fragment the precursor and create radicals which enhance the deposition rate.

The process chamber can then be purged, at 406. The purge generally includes flowing an inert gas into the chamber to remove excess reactants and byproducts. The inert gas is any gas which is significantly non-reactive with the components of the substrate, the aluminum-containing gas or other gases involved in the deposition process. In one implementation, the aluminum-containing precursor from element 404 is stopped while the inert gas from element 404 is continued at the same or an increased flow rate. Thus, the inert gas from element 404 which acts as a carrier gas becomes the purge gas of element 406.

Once the process region is purged, a UV responsive nitrogen-containing precursor can be delivered to the process region, at 408. The UV responsive nitrogen-containing precursor may include, but is not necessarily limited to nitrogen, ammonia, hydrazine, tert-butylamine, 1,1-dimethylhydrazine and tert-butylhydrazine. The UV responsive nitrogen-containing precursor can be delivered at a flow rate from about 2 standard cubic centimeters per minute (sccm) to about 5000 sccm in an inert gas flow from about 100 sccm to about 20000 sccm. In another implementation, the UV responsive nitrogen-containing precursor can be delivered at a flow rate from about 10 sccm to about 2500 sccm in an inert gas flow from about 250 sccm to about 10000 sccm. In another implementation, the UV responsive nitrogen-containing precursor can be delivered at a flow rate from about 100 sccm to about 1000 sccm in an inert gas flow from about 1000 sccm to about 5000 sccm.

The UV responsive nitrogen-containing precursor is also activated using UV radiation. The UV radiation can have a wavelength of between 170 nm to about 400 nm. The UV responsive nitrogen-containing precursor may be activated at a different wavelength or the same wavelength as the aluminum-containing precursor. The temperature of the process region can be maintained between about 0 degrees Celsius and about 200 degrees Celsius, such as between about 0 degrees Celsius and about 100 degrees Celsius. Once activated, the UV responsive nitrogen-containing precursor will create a reactive nitrogen species which will react with the reactive aluminum species on the surface of the substrate. Deposition of both the UV responsive nitrogen-containing precursor and the aluminum-containing precursor on the substrate surface is not self-limiting (i.e., the layer thickness is related to the amount of time each precursor is activated and present to deposit on the substrate). In one implementation, the layer is between 1 Å and 50 Å thick.

In one implementation using $NH_3$ gas, the $NH_3$ gas is delivered in the presence of UV radiation, which creates NH* radicals. The NH* radicals will react with the adsorbed surface species (e.g., aluminum species from element 404), which will remove the organic ligands and —H to create high quality, dense AlN film. $NH_3$ concentration, pressure, and UV power can be modulated to enhance the film quality.

The process chamber can then be purged, at 410. The purge generally includes flowing an inert gas into the chamber to remove excess reactants and byproducts. The inert gas flow rate, composition and other parameters can be substantially similar to the inert gas described with reference to element 406. The inert gas used in element 410 may be different from the inert gas used in element 406

Once reactive gases have been purged, the delivering of the aluminum containing precursor, purging, the delivering of the UV responsive nitrogen-containing gas and second purging can be repeated until the desired thickness is achieved, at 412. A plurality of layers can be deposited to form the etch stop layer. The layers may be of varying thicknesses or the thickness may be substantially equal between deposition cycles.

The above described method of UV assisted CVD for the deposition of etch stop layers, such as an AlN layer. The etch stop layer may consist of a plurality of layers deposited in a cyclical fashion. UV assisted deposition of the etch stop layer allows for a reduced thermal budget, increased deposition rate, and a more conformal layer while avoiding the possible damage to ULK layers during the deposition process. Further, the method described above provides the benefit of reducing the width of the layer while maintaining the effectiveness of the etch stop.

While the foregoing is directed to implementations of the present methods and apparatus, other and further implementations of the methods and apparatus may be devised without departing from the basic scope thereof, including the claims that follow.

What is claimed is:

1. A method of depositing an etch stop layer, the method comprising:
    positioning a substrate in a process region of a process chamber;
    delivering an aluminum-containing precursor to the process region, the aluminum-containing precursor being activated using UV radiation, the aluminum-containing precursor depositing an aluminum species onto the substrate;
    purging the process region of the aluminum-containing precursor;
    delivering a UV responsive nitrogen-containing precursor to the process region;
    activating the UV responsive nitrogen-containing precursor using UV radiation to create nitrogen radicals, the nitrogen radicals reacting with the aluminum species to form an aluminum nitride (AlN) layer; and
    purging the process region of UV responsive nitrogen-containing precursor, wherein the delivering an aluminum-containing precursor, the purging the process region of the aluminum-containing precursor, the delivering a UV responsive nitrogen-containing precursor, and the purging the process region of UV responsive nitrogen-containing precursor are repeated one or more times to create an AlN stack.

2. The method of claim 1, wherein the aluminum-containing precursor is trimethylaluminum (TMA).

3. The method of claim 1, wherein the UV responsive nitrogen-containing precursor is ammonia (NH$_3$).

4. The method of claim 1, wherein an inert gas is continuously flowed between delivering the aluminum-containing precursor and purging the process region of aluminum-containing precursor.

5. The method of claim 1, wherein the aluminum-containing precursor and the UV responsive nitrogen-containing precursor are activated by UV radiation in the process region.

6. The method of claim 5, wherein the UV radiation has a wavelength of between 185 nm and 225 nm.

7. The method of claim 1, wherein the AlN layer is deposited as part of a BEOL process.

8. A method of depositing an etch stop layer, the method comprising:
    positioning a substrate in a process region of a process chamber;
    depositing a plurality of layers collectively comprising the etch stop layer, the deposition comprising:
        delivering an aluminum-containing precursor to the process region, the aluminum-containing precursor being activated using UV radiation, the aluminum-containing precursor depositing an aluminum species onto the substrate;
        purging the process region of the aluminum-containing precursor using an inert gas;
        delivering a UV responsive nitrogen-containing gas to the process region, the UV responsive nitrogen-containing gas being activated using UV radiation to create nitrogen radicals, the nitrogen radicals reacting with the aluminum species to form an aluminum nitride (AlN) layer;
        purging the process region of UV responsive nitrogen-containing gas using the inert gas; and
        repeating the delivering an aluminum-containing precursor, the purging of aluminum-containing precursor, the delivering a UV responsive nitrogen-containing gas, and the purging of UV responsive nitrogen-containing gas until a desired thickness is achieved.

9. The method of claim 8, wherein the aluminum-containing precursor is trimethylaluminum (TMA).

10. The method of claim 8, wherein the UV responsive nitrogen-containing gas is ammonia (NH$_3$).

11. The method of claim 8, wherein the inert gas is continuously flowed between the delivering the aluminum-containing precursor and the purging the process region of aluminum-containing precursor.

12. The method of claim 8, wherein the repeating the delivering an aluminum-containing precursor, the purging of aluminum-containing precursor, the delivering a UV responsive nitrogen-containing gas, and the purging of UV responsive nitrogen-containing gas creates an AlN stack.

13. The method of claim 8, wherein the aluminum-containing precursor and the UV responsive nitrogen-containing gas are activated by UV radiation in the process region.

14. The method of claim 13, wherein the UV radiation has a wavelength of between 185 nm and 225 nm.

15. The method of claim 8, wherein the AlN layer is deposited as part of a BEOL process.

16. A method of depositing an etch stop layer, the method comprising:
    positioning a substrate in a process region of a process chamber;
    delivering trimethylaluminum (TMA) to the process region, the TMA being activated using UV radiation in the process region, the TMA depositing an aluminum species onto the substrate;
    purging the process region of the TMA using an inert gas;
    delivering a UV responsive nitrogen-containing gas to the process region, the UV responsive nitrogen-containing gas being activated using UV radiation in the process region, the UV responsive nitrogen-containing gas being activated using UV radiation to create nitrogen radicals, the nitrogen radicals reacting with the aluminum species to form an aluminum nitride (AlN) layer; and
    purging the process region of UV responsive nitrogen-containing gas using an inert gas, wherein the delivering TMA, the purging of TMA, the delivering a UV responsive nitrogen-containing gas, and the purging of UV responsive nitrogen-containing gas are repeated one or more times to create an AlN stack.

17. The method of claim 16, wherein the UV radiation has a wavelength of between 185 nm and 225 nm.

* * * * *